United States Patent
Lin et al.

(10) Patent No.: US 11,757,024 B2
(45) Date of Patent: Sep. 12, 2023

(54) ETCH SELECTIVITY CONTROL FOR EPITAXY PROCESS WINDOW ENLARGEMENT IN SEMICONDUCTOR DEVICES

(71) Applicant: Taiwan Semiconductor Manufacturing Company Ltd., Hsinchu (TW)

(72) Inventors: Shih-Yao Lin, New Taipei (TW); Te-Yung Liu, Hsinchu (TW); Chih-Han Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 24 days.

(21) Appl. No.: 17/224,528

(22) Filed: Apr. 7, 2021

(65) Prior Publication Data
US 2022/0328653 A1 Oct. 13, 2022

(51) Int. Cl.
*H01L 29/66* (2006.01)
*H01L 29/78* (2006.01)

(52) U.S. Cl.
CPC ........ *H01L 29/6681* (2013.01); *H01L 29/785* (2013.01)

(58) Field of Classification Search
CPC .......................... H01L 29/6681; H01L 29/785
See application file for complete search history.

(56) References Cited

U.S. PATENT DOCUMENTS

2017/0005188 A1* 1/2017 Cheng ............... H01L 29/42392
2019/0148551 A1* 5/2019 More .............. H01L 21/823864
   257/192
2020/0328207 A1* 10/2020 Hong .............. H01L 21/823481

FOREIGN PATENT DOCUMENTS

| TW | 202020989 A | 6/2020 |
| TW | 202101546 A | 1/2021 |
| TW | 202109635 A | 3/2021 |

* cited by examiner

*Primary Examiner* — Christine A Enad
(74) *Attorney, Agent, or Firm* — FOLEY & LARDNER LLP

(57) ABSTRACT

A semiconductor device and method for fabricating a semiconductor device includes etch selectivity tuning to enlarge epitaxy process windows. Through modification of etching processes and careful selection of materials, improvements in semiconductor device yield and performance can be delivered. Etch selectivity is controlled by using dilute gas, using assistive etch chemicals, controlling a magnitude of bias power used in the etching process, and controlling an amount of passivation gas used in the etching process, among other approaches. A recess is formed in a dummy fin in a region of the semiconductor where epitaxial growth occurs to further enlarge the epitaxy process window.

20 Claims, 12 Drawing Sheets

US 11,757,024 B2

1

ETCH SELECTIVITY CONTROL FOR EPITAXY PROCESS WINDOW ENLARGEMENT IN SEMICONDUCTOR DEVICES

BACKGROUND

The present disclosure generally relates to semiconductor devices and methods for fabricating semiconductor devices, and particularly to epitaxial growth processes used in the fabrication of semiconductor devices. As feature size continues to decrease in semiconductor devices, challenges may arise in epitaxial growth processes due to limited size of associated epitaxial regions for growing the epitaxial material. This phenomenon can lead to undesirable outcomes with respect to semiconductor device yield and performance. Semiconductor devices are used in a wide variety of electronics, and improvements regarding both production and performance of semiconductor devices are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
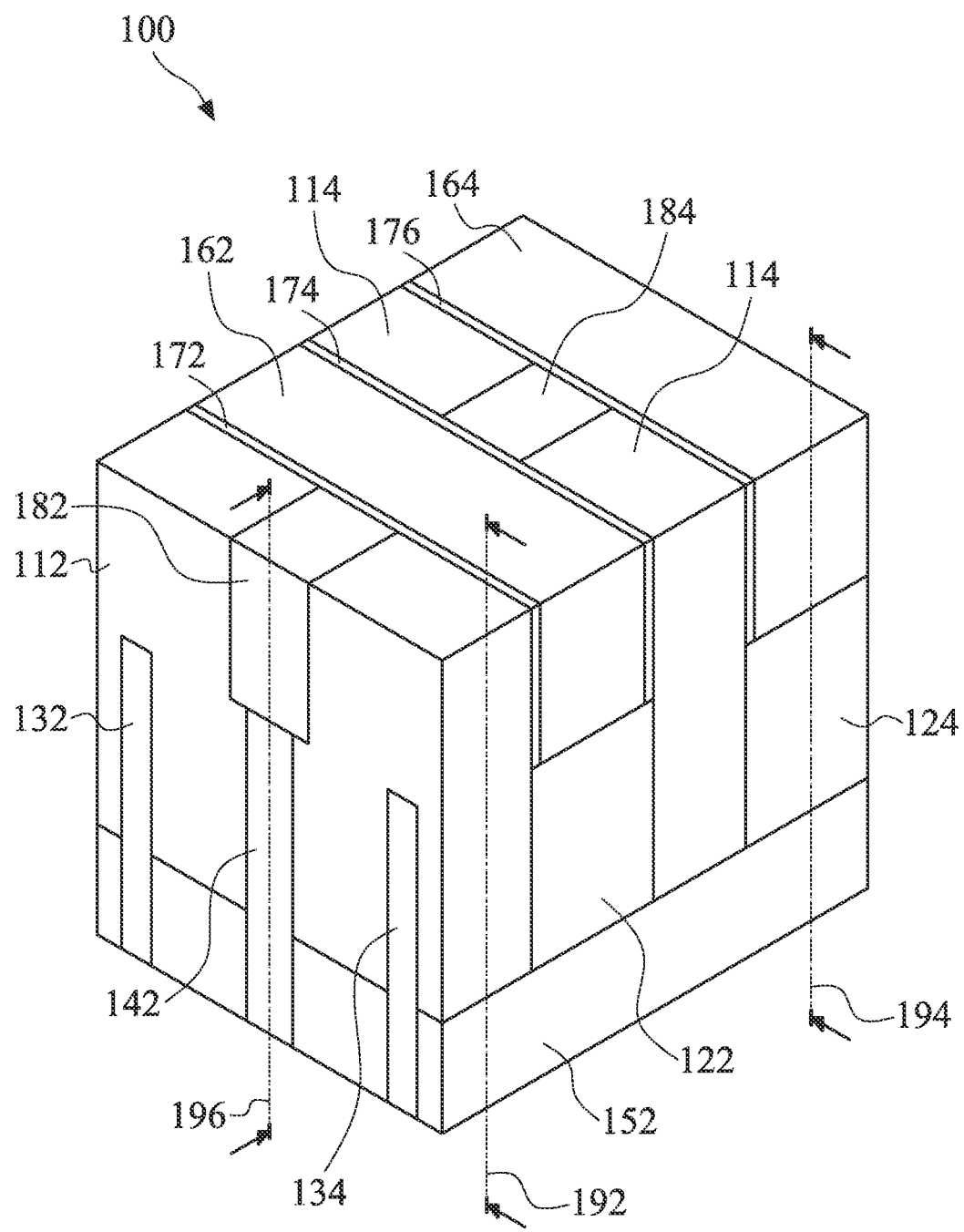
FIG. 1 illustrates a perspective view of an example semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor device and method for fabricating a semiconductor device. As feature size continues to decrease in semiconductor devices, challenges can arise in epitaxial growth processes due to limited size of associated epitaxial regions for growing epitaxial material. Through modification of etching processes and careful selection of materials used to fabricate the semiconductor device, the present disclosure provides etch selectivity control to enlarge epitaxial regions. The approaches disclosed herein can thereby deliver improvements in semiconductor device yield and performance.

Referring now to FIG. 1, a perspective view of an example semiconductor device 100 is shown, in accordance with some embodiments. Semiconductor device 100 is generally a fin field-effect transistor (FinFET) structure, however semiconductor device 100 can also be implemented using similar transistor structures including using a nanosheet field-effect transistor structure, a gate-all-around field-effect transistor (GAAFET) structure, or another similar type of transistor structure. Semiconductor device 100 is shown to include a gate 112, a gate 114, a source/drain region 122, a source/drain region 124, an active fin 132, an active fin 134, a dummy fin 142, an isolation structure 152, an insulating layer 162, an insulating layer 164, a spacer layer 172, a spacer layer 174, a spacer layer 176, a dielectric layer 182, and a dielectric layer 184. Also shown in FIG. 1 are three cross sections: a cross section 192 cut with gate 112, a cross section 194 cut with source/drain region 124, and a cross section 196 cut with dummy fin 142. Semiconductor device 100 can generally be implemented in an integrated circuit (IC).

Gate 112 and gate 114 can both be implemented as high-k metal gate (HKMG) structures. In such implementations, a stack including conductive metal material and dielectric material with a high dielectric constant (high-k) is formed. The stack can also include a work function layer, a capping layer, and/or other layers to form a suitable HKMG structure for the intended application. The HKMG structure can be formed using a variety of suitable processes, including both gate-first and gate-last implementations. Gate 112 and gate 114 are disposed in generally parallel relation, and can be part of a parallel gate stack that includes additional, similar gate structure not shown in FIG. 1. In some applications, the use of a HKMG structure as compared to the use of a polysilicon gate can provide reduced charge leakage and thereby improved performance. However, it will be appreciated that the techniques described herein can also be applied to semiconductor devices with polysilicon gate structures, among other types of gate structures.

Source/drain region 122 and source/drain region 124 are both formed using epitaxial material in an epitaxial growth process. The finalized source and drain structures formed in source/drain region 122 and source/drain region 124 can thereby be crystalline structures based on the epitaxial material or condition. For example, an epitaxy region for forming source/drain region 122 can be opened by removing portions of active fin 132, active fin 134, dummy fin 142, spacer layer 172, and spacer layer 174. Then, epitaxial growth processes such as chemical vapor deposition (CVD), vapor-phase epitaxy (VPE), molecular-beam epitaxy (MBE), liquid-phase epitaxy (LPE), and other suitable processes and combinations thereof can be used to form the epitaxial material for source/drain region 122 within the epitaxy region. Similarly, an epitaxy region for forming source/drain region 124 can be opened by removing portions of active fin 132, active fin 134, dummy fin 142, and spacer layer 176. Then, the epitaxial material for source/drain region 124 can be formed within the epitaxy region using suitable epitaxial growth processes. Source/drain region 122 and source/drain region 124 can be doped using suitable dopants including n-type and p-type dopants such as arsine, phosphine, diborane, and other suitable dopants and combinations thereof.

Active fin 132 and active fin 134 are generally formed of conductive material and provide a pathway for current to flow. Active fin 132 and active fin 134 can be formed using materials such as silicon (Si), silicon germanium (SiGe), and other suitable semiconductor materials and combinations thereof. In some embodiments, semiconductor device 100 is a FinFET device, and active fin 132 and active fin 134 are active fins of the FinFET device. Active fin 132 and active fin 134 generally extend above isolation structure 152 and are disposed in generally parallel relation to dummy fin 142.

Dummy fin 142 is generally formed of dielectric material and does not provide a pathway for current to flow as active fin 132 and active fin 134 do. Instead, dummy fin 142 can reduce strain on a substrate of semiconductor device 100 by providing a structure similar to active fin 132 and active fin 134 in an inactive region of semiconductor device 100. As shown in FIG. 1, active fin 132 and active fin 134 are disposed on opposing sides of dummy fin 142 and in parallel relation to dummy fin 142, such that active fin 132 and active fin 134 are disposed on an outer region of semiconductor device 100 and dummy fin 142 is disposed on an inner region of semiconductor device 100. The inclusion of dummy fin 142 can further provide critical dimension (CD) uniformity in semiconductor device 100, and can thereby provide improved ease and efficiency with respect to fabrication of semiconductor device 100 as well improved performance of semiconductor device 100. In some embodiments, dummy fin 142 is the same or about the same in size and shape as active fin 132 and active fin 134. However, dummy fin 142 can also be implemented as being larger, smaller, thicker, thinner, taller, or shorter when compared to active fin 132 and active fin 134. In some embodiments, semiconductor device 100 is a FinFET device, and dummy fin 142 is an inactive fin of the FinFET device. Dummy fin 142 can be formed as a single film or a complex film, and can be formed using materials such as silicon dioxide ($SiO_2$), silicon oxynitride (SiON), silicon nitride ($Si_3N_4$), silicon carbon nitride (SiCN), silicon oxycarbonitride (SiOCN), hafnia ($HfO_2$), tantalum nitride (TaN), and other suitable materials and combinations thereof. Dummy fin 142 can be formed using a variety of suitable deposition processes, including physical vapor deposition, chemical vapor deposition, electrochemical deposition, atomic layer deposition, and other suitable processes and combinations thereof.

Isolation structure 152 generally prevents leakage of electric current between components of semiconductor device 100. Isolation structure 152 can be implemented as a shallow trench isolation (STI) structure, for example. Isolation structure 152 can be formed by creating trenches within a substrate of semiconductor device 100 (e.g. a bulk silicon substrate), filling the trenches with insulating material (e.g. dielectric material such as silicon dioxide), and removing excess insulating material using processes such as chemical-mechanical polishing (CMP). Isolation structure 152 can generally provide a base for forming other components of semiconductor device 100 such as active fin 132, active fin 134, dummy fin 142, gate 114, and source/drain region 122 thereon.

Insulating layer 162 and insulating layer 164 can be implemented using various types of materials. For example, insulating layer 162 and insulating layer 164 can be implemented as inter-layer dielectrics (ILD) and/or contact etch stop layers (CESL). In implementations where insulating layer 162 and/or insulating layer 164 are inter-layer dielectrics, insulating layer 162 and/or insulating layer 164 can be formed using dielectric materials with a low dielectric constant (low-k materials) such as doped silicon dioxide, porous silicon dioxide, and other suitable materials and combinations thereof.

Spacer layer 172, spacer layer 174, and spacer layer 176 are generally implemented as dielectric layers. For example, spacer layer 172, spacer layer 174, and spacer layer 176 can be formed using materials such as silicon dioxide ($SiO_2$), silicon oxynitride (SiON), silicon nitride ($Si_3N_4$), silicon carbon nitride (SiCN), silicon oxycarbonitride (SiOCN), hafnia ($HfO_2$), tantalum nitride (TaN), and other suitable materials and combinations thereof. In some embodiments, spacer layer 172, spacer layer 174, and spacer layer 176 are each implemented as multi-layer spacers formed of different materials. In some embodiments, a single spacer structure may also be defined by two or more spacer layers. For example, spacer 174 and spacer layer 176 may cooperatively define a single spacer structure designed to electrically isolate gate 114. Spacer layer 172 at least partially surrounds gate 112 to provide electrical isolation of gate 112. Spacer layer 174 and spacer layer 176 at least partially surround gate 114 to provide electrical isolation of gate 114. Spacer layer 172, spacer layer 174, and spacer layer 176 can be implemented using dielectric materials with a high dielectric constant (high-k materials), dielectric materials with a low dielectric constant (low-k materials), or a combination thereof.

Dielectric layer 182 and dielectric layer 184 are generally disposed above dummy fin 142. Dielectric layer 182 provides electrical isolation of gate 112, and dielectric layer 184 provides electrical isolation of gate 114. Dielectric layer 182 and dielectric layer 184 can be disposed above dummy fin 142 in certain areas of semiconductor device 100 to provide electrical isolation for structures such as gate 112, gate 114, and other similar structures. Dielectric layer 182 and dielectric layer 184 can be formed using dielectric materials with a high dielectric constant (high-k materials), dielectric materials with a low dielectric constant (low-k materials), or a combination thereof, including materials such silicon dioxide ($SiO_2$), silicon oxynitride (SiON), silicon nitride ($Si_3N_4$), silicon carbon nitride (SiCN), silicon oxycarbonitride (SiOCN), hafnia ($HfO_2$), tantalum nitride (TaN), and other suitable materials and combinations thereof. In some embodiments, dielectric layer 182 and dielectric layer 184 are not implemented within semiconductor device (e.g. in different implementations of gate 112 and gate 114 where dielectric layer 182 and dielectric layer 184 are not needed). Dielectric layer 182 and dielectric layer 184 can be formed by cutting gate 112 and gate 114, respectively, and filling the cut portions of gate 112 and gate 114 with dielectric material.

FIGS. 2A-2J illustrate cross sections of semiconductor device 100 as cut from cross section 194 illustrated in FIG. 1 (cut with source/drain region 124). The cross sections illustrated in FIGS. 2A-2J show various example embodiments of dummy fin 142, wherein a portion of dummy fin 142 is removed to form a recess in dummy fin 142 in a region of semiconductor device 100 coinciding with source/drain region 124. As discussed in more detail below, the portion of dummy fin 142 is removed when an epitaxial region for forming source/drain region 124 using an epitaxial growth process is opened. The epitaxial region is opened by removing portions of active fin 132, spacer layer 176, and active fin 134. When removing these portions of active fin 132, spacer layer 176, and active fin 134, a portion of dummy fin 142 is also be removed to form the recess in dummy fin 142. Then, source/drain region 124 can be formed using epitaxial material within the epitaxy region, adjacent dummy fin 142, and at least partially within the recess formed within dummy fin 142.

Figure 2A:
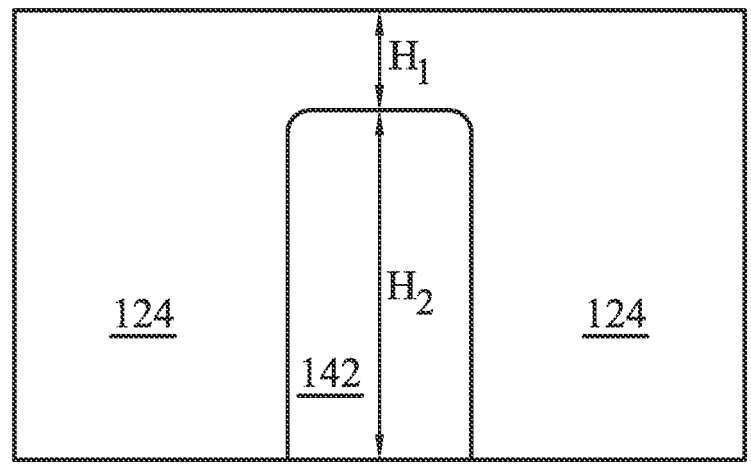
FIGS. 2A-2I illustrate cross sections of the semiconductor device of FIG. 1 cut with a source/drain region, in accordance with some embodiments.

In FIG. 2A, a height of the recess formed in dummy fin 142 is denoted by the variable $H_1$, and a height of the remaining portion of dummy fin 142 is denoted by the variable $H_2$. The geometrical shape of dummy fin 142 in FIG. 2A is generally flat on a top surface of dummy fin 142 where the recess is formed. In FIG. 2A, the height $H_1$ is significantly smaller than the height $H_2$. Depending on the intended application, the embodiment illustrated in FIG. 2A can provide improvements with respect to yield and performance of semiconductor device 100.

Figure 2B:
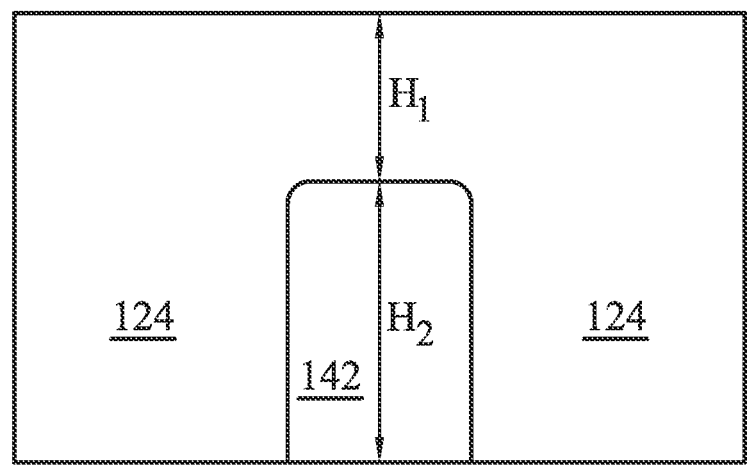

In FIG. 2B, the height of the recess formed in dummy fin 142 is denoted by the variable $H_1$, and the height of the remaining portion of dummy fin 142 is denoted by the variable $H_2$. Like the embodiment illustrated in FIG. 2A, the geometrical shape of dummy fin 142 in FIG. 2B is generally flat on a top surface of dummy fin 142 where the recess is formed. However, in FIG. 2B, the height $H_1$ is shorter than the height $H_2$, but by less of a margin than the embodiment illustrated in FIG. 2A. The height of the recess formed in dummy fin 142 can be increased or decreased for different purposes. Depending on the intended application, the embodiment illustrated in FIG. 2B can provide improvements with respect to yield and performance of semiconductor device 100.

Figure 2C:
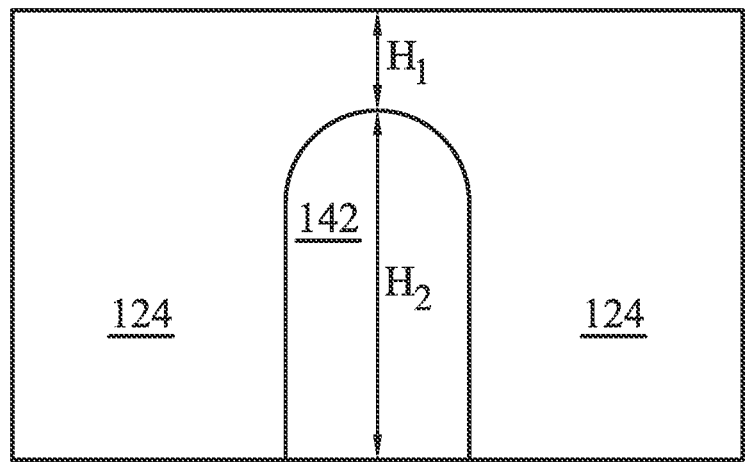

In FIG. 2C, the height of the recess formed in dummy fin 142 is denoted by the variable $H_1$, and the height of the remaining portion of dummy fin 142 is denoted by the variable $H_2$. Unlike the embodiments illustrated in FIG. 2A and FIG. 2B, the geometrical shape of dummy fin 142 in FIG. 2C is generally round on a top surface of dummy fin 142 where the recess is formed. The geometrical shape of the recess formed in dummy fin 142 can be varied for different purposes. For example, a round surface may be easier to form in certain instances than a flat surface. Depending on the intended application, the embodiment illustrated in FIG. 2C can provide improvements with respect to yield and performance of semiconductor device 100.

Figure 2D:
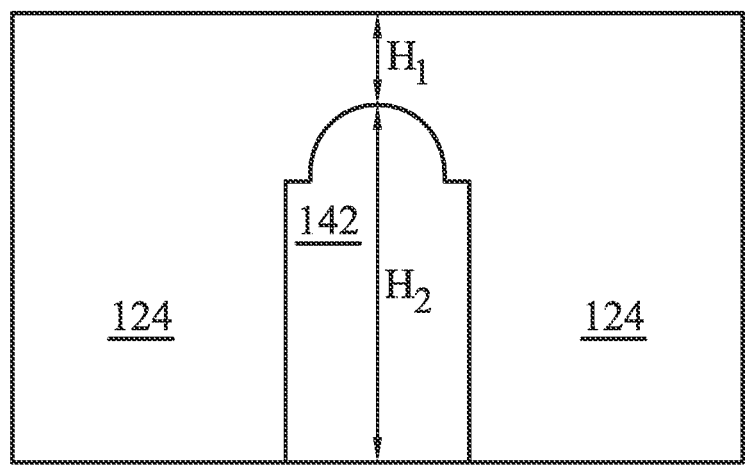

In FIG. 2D, the height of the recess formed in dummy fin 142 is denoted by the variable $H_1$, and the height of the remaining portion of dummy fin 142 is denoted by the variable $H_2$. The geometrical shape of dummy fin 142 in FIG. 2D is generally round on a middle portion of the top surface of dummy fin 142 where the recess is formed, and generally flat on the outer portions of the top surface of dummy fin 142 where the recess is formed. Depending on the intended application, the embodiment illustrated in FIG. 2D can provide improvements with respect to yield and performance of semiconductor device 100.

Figure 2E:
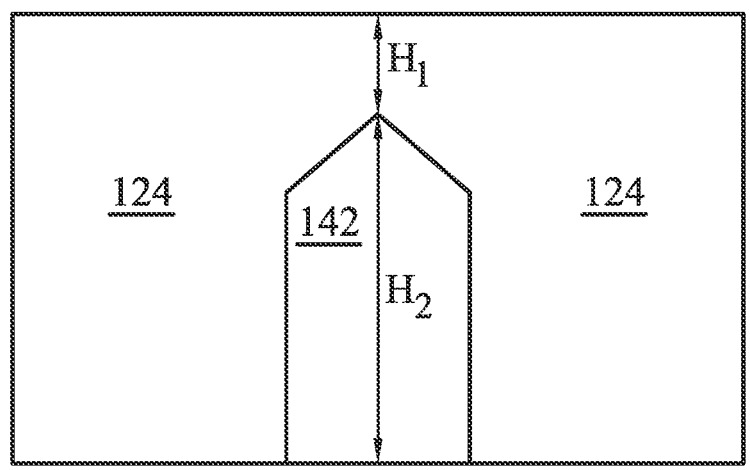

In FIG. 2E, the height of the recess formed in dummy fin 142 is denoted by the variable $H_1$, and the height of the remaining portion of dummy fin 142 is denoted by the variable $H_2$. The geometrical shape of dummy fin 142 in FIG. 2E is generally pointed (needle shape) in a middle portion of the top surface of dummy fin 142 where the recess is formed, such that generally flat, downward sloped outer portions are formed on the top surface of dummy fin 142 where the recess is formed. Depending on the intended application, the embodiment illustrated in FIG. 2E can provide improvements with respect to yield and performance of semiconductor device 100.

Figure 2F:
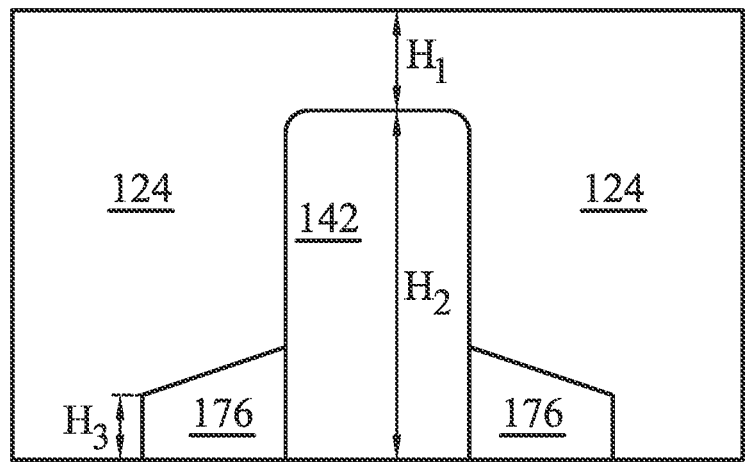

In FIG. 2F, the height of the recess formed in dummy fin 142 is denoted by the variable $H_1$, and the height of the remaining portion of dummy fin 142 is denoted by the variable $H_2$. Also, in FIG. 2F, a portion of spacer layer 176 remains after the epitaxy region for forming source/drain region 124 is opened. The height of this remaining portion of spacer layer 176 is denoted by the variable $H_3$. In different applications, it may not be practical and/or desirable to remove all of the material from spacer layer 176 within the epitaxy region for forming source/drain region 124. In FIG. 2F, the height $H_1$ is relatively small, and the height $H_3$ is relatively large. Depending on the intended application, the embodiment illustrated in FIG. 2F can provide improvements with respect to yield and performance of semiconductor device 100.

Figure 2G:
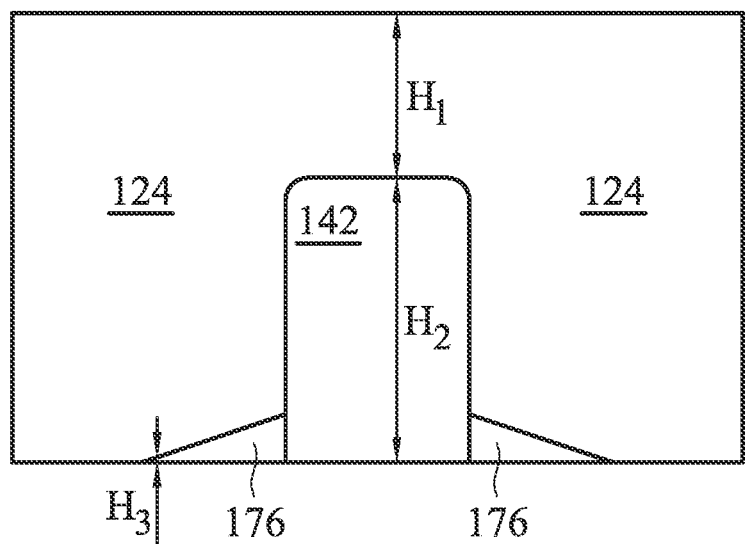

In FIG. 2G, the height of the recess formed in dummy fin 142 is denoted by the variable $H_1$, and the height of the remaining portion of dummy fin 142 is denoted by the variable $H_2$. Also, in FIG. 2G, a portion of spacer layer 176 remains after the epitaxy region for forming source/drain region 124 is opened, and the height of this remaining portion of spacer layer 176 is denoted by the variable $H_3$. When viewed in comparison to the embodiment illustrated in FIG. 2F, the height $H_1$ is relatively large, and the height $H_3$ is relatively small. That is, as more of dummy fin 142 is removed, more of spacer layer 176 is also removed in some applications (e.g. when dummy fin 142 and spacer layer 176 are formed using similar materials, as discussed in more detail below). Depending on the intended application, the embodiment illustrated in FIG. 2G can provide improvements with respect to yield and performance of semiconductor device 100.

Figure 2H:
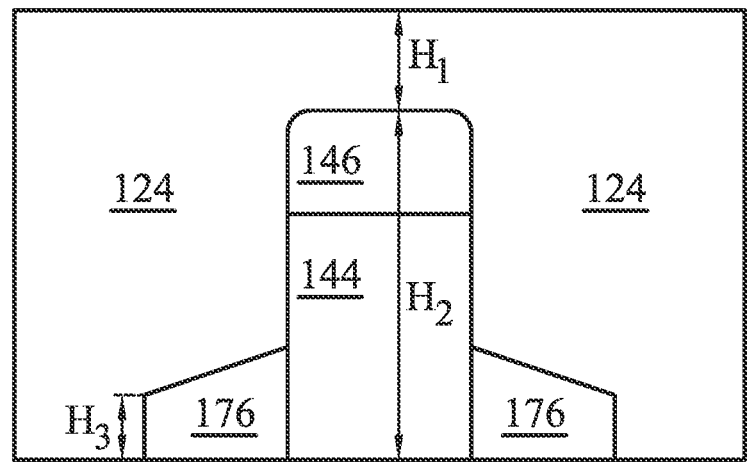

In FIG. 2H, the height of the recess formed in dummy fin 142 is denoted by the variable $H_1$, and the height of the remaining portion of dummy fin 142 is denoted by the variable $H_2$. Also, in FIG. 2H, a portion of spacer layer 176 remains after the epitaxy region for forming source/drain region 124 is opened, and the height of this remaining portion of spacer layer 176 is denoted by the variable $H_3$. Notably, in FIG. 2H, dummy fin 142 is formed using two different materials: a first material 144 and a second material 146. The first material 144 is different from the material used to form spacer layer 176 such that the first material 144 has a lower etch rate than the etch rate of spacer layer 176. The second material 146 is similar or the same as the material used to form spacer layer 176 such that the second material 146 has an etch rate that is similar or the same as the etch rate of spacer layer 176. Depending on the intended application, the embodiment illustrated in FIG. 2H can provide improvements with respect to yield and performance of semiconductor device 100.

It will be appreciated that dummy fin 142 can be formed using different materials, including using complex materials (i.e. a combination of materials) such as illustrated in the embodiment of FIG. 2H. If dummy fin 142 is formed using the first material 144 that has a lower, but not substantially lower, etch rate as spacer layer 176, the height $H_3$ will decrease as the height $H_1$ increases, such as illustrated in the embodiments shown in FIG. 2F and FIG. 2G. If dummy fin 142 is formed using the second material 146 that has a substantially lower etch rate than the etch rate of spacer layer 176 (and thereby a lower etch rate than the first material 144), the height $H_3$ can generally be decreased without significantly affecting the height $H_1$. Moreover, as illustrated in the embodiment shown in FIG. 2H, dummy fin 142 can be strategically formed of complex material in order to more precisely control the heights $H_1$ and $H_3$ for the intended application. As an example, the first material 144 can be used to form dummy fin 142 in p-type metal-oxide-semiconductor (PMOS) applications, whereas the second material 146 can be used to form dummy fin 146 in complementary metal-oxide-semiconductor (CMOS) applications. As another example, the first material 144 can be used to form dummy fin 142 in static random-access memory (SRAM) applications, whereas the second material 146 can be used to form dummy fin 146 in input/output (I/O) applications.

Figure 2I:
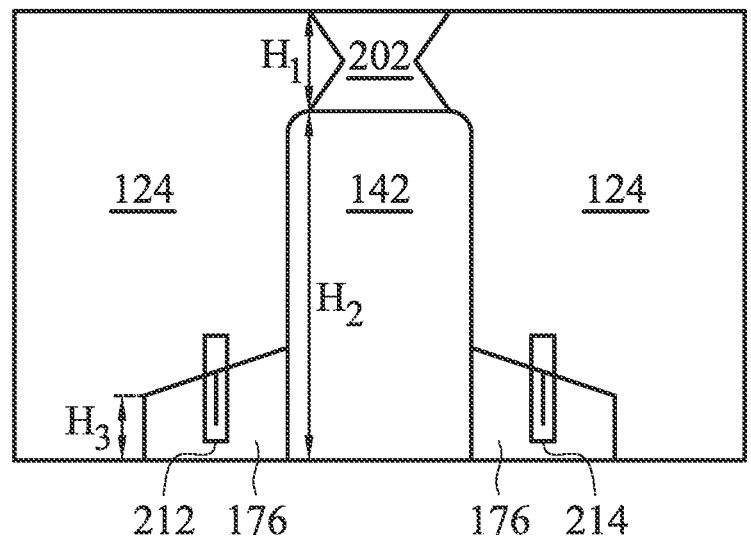

In FIG. 2I, the height of the recess formed in dummy fin 142 is denoted by the variable $H_1$, and the height of the remaining portion of dummy fin 142 is denoted by the variable $H_2$. Also, in FIG. 2I, a portion of spacer layer 176 remains after the epitaxy region for forming source/drain region 124 is opened, and the height of this remaining portion of spacer layer 176 is denoted by the variable $H_3$. Additionally, in FIG. 2I, a gap 202 is formed above dummy fin 142 to separate source/drain region 124 into two parts (i.e. a source region and a drain region), and the remaining portion of spacer layer 176 includes two voids on opposing sides of dummy fin 142: a void 212 and a void 214. In practice, the epitaxial material that forms source/drain region 124 is typically separated into two separate regions as illustrated in FIG. 2I. This will be understood as true for the embodiments illustrated in FIGS. 2A-2H as well (although not expressly illustrated in FIGS. 2A-2H). In some embodiments, the separate source and drain regions are merged together. The gap 202 can be filled with an insulating material such as insulating layer 164, or the gap 202 can be filled with air or another type of material. In practice, when removing portions of spacer layer 176 to open the epitaxy region for forming source/drain region 124, voids such as void 212 and void 214 can be intentionally or unintentionally formed within spacer layer 176. In this sense, FIG. 2I provides more of a practical illustration of a cross section of semiconductor device 100 cut from cross section 194 illustrated in FIG. 1. Depending on the intended application, the embodiment illustrated in FIG. 2I can provide improvements with respect to yield and performance of semiconductor device 100.

Figure 3:
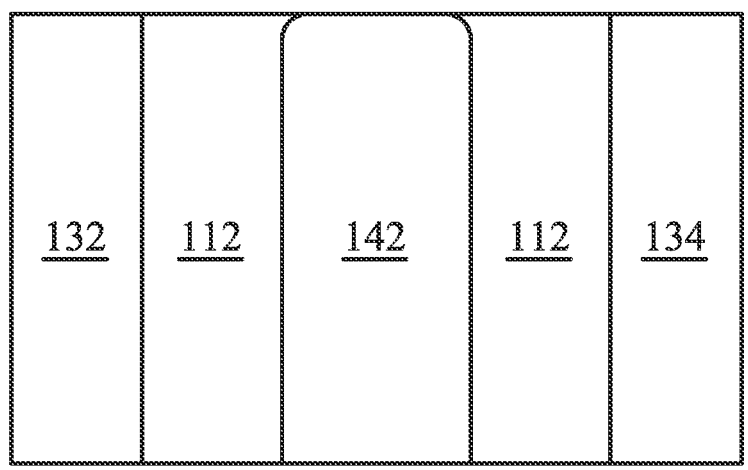
FIG. 3 illustrates a cross section of the semiconductor device of FIG. 1 cut with a gate region, in accordance with some embodiments.

FIG. 3 illustrates a partial cross section of semiconductor device 100 as cut from cross section 192 illustrated in FIG. 1 (cut with gate 112). As shown in FIG. 3, there is no recess formed in dummy fin 142 in the region of semiconductor device 100 where gate 112 is disposed. Likewise, there is no recess formed in dummy fin 142 in the region of semiconductor device 100 where gate 114 is disposed. However, similar to the example recesses illustrated in FIGS. 2A-2I, a recess is formed in dummy fin 142 in the region of semiconductor device 100 where source/drain region 122 is disposed, similar to the recess formed in dummy fin 142 in the region of semiconductor device 100 where source/drain region 124 is disposed. By only forming recesses in dummy fin 142 in regions of semiconductor device 100 where epitaxial growth occurs, improvements in the epitaxial growth processes can be achieved without sacrificing electrical isolation provided by dummy fin 142 in other areas of semiconductor device 100. While spacer structures for gate 112 are not shown in FIG. 3, it will be appreciated that spacer structures (e.g. spacer layer 172) such as gate dielectrics (e.g. silicon oxide, silicon nitride, etc.) may be formed at least partially over dummy fin 142, active fin 132, and/or active fin 134. It will be appreciated that, while not explicitly shown in FIG. 3, the gate 112 extends above dummy fin 142, active fin 132, and active fin 134 in the final structure of semiconductor device 100.

Figure 4A:
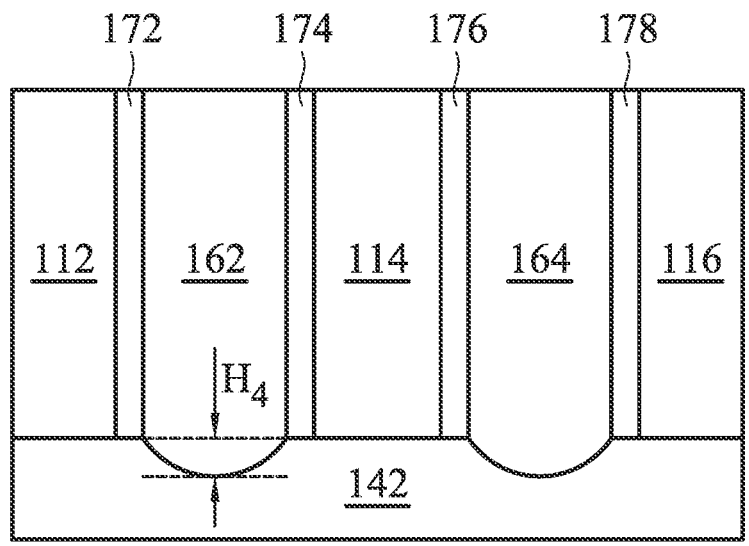
FIGS. 4A-4C illustrate cross sections of the semiconductor device of FIG. 1 cut with a dummy fin region, in accordance with some embodiments.
Figure 4B:
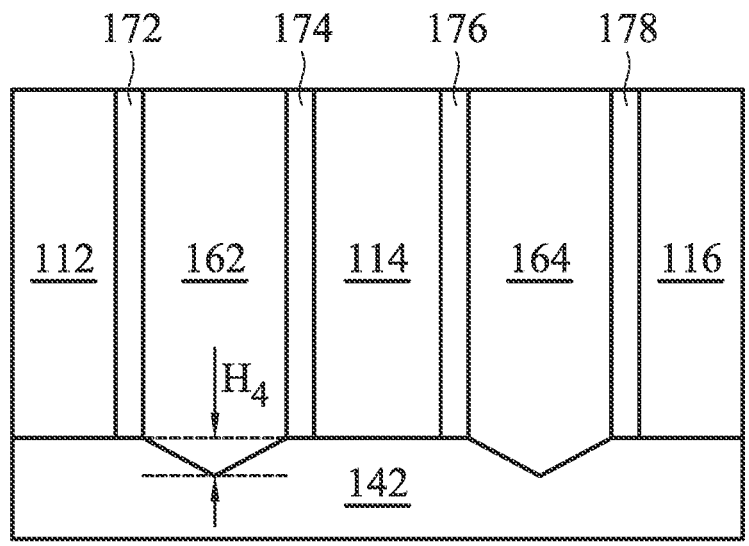
Figure 4C:
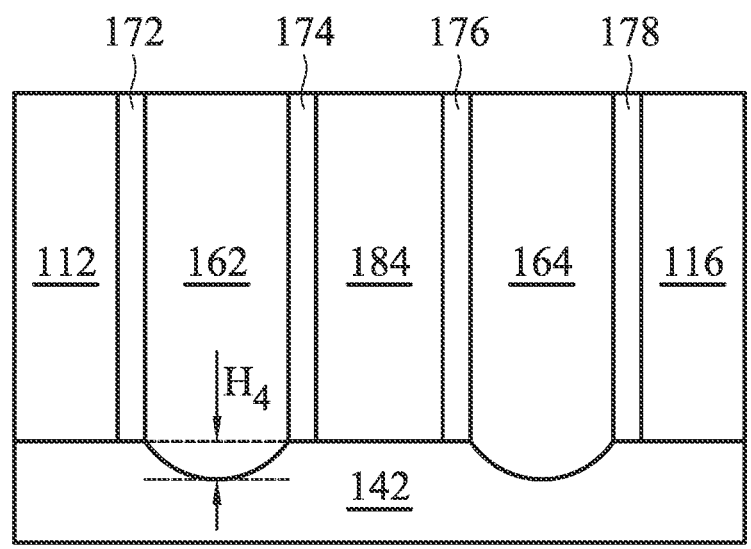

FIGS. 4A-4C illustrate cross sections of semiconductor device 100 as cut from cross section 196 illustrated in FIG. 1 (cut with dummy fin 142). FIGS. 4A-4C provide a different perspective view of the recesses formed within dummy fin 142 to facilitate epitaxial growth processes. In FIGS. 4A-4C, the height of the dummy fin recess is denoted by the variable $H_4$. From the perspectives shown in FIGS. 4A-4C, insulating material from insulating layer 162 and insulating layer 164 extend into and at least partially fill the recesses formed in the top surface of dummy fin 142 (the surface opposite isolation structure 152). More detail regarding formation of the recesses is described below with respect to process 500.

In FIG. 4A, the recesses formed in dummy fin 142 generally have round geometric shapes. From the perspective shown in FIG. 4A, the recesses formed in dummy fin 142 lie below insulating layer 162 and insulating layer 164, such that insulating material (e.g. low-k dielectric material, or other insulating material) from insulating layer 162 and insulating layer 164 extends into the recesses. The recesses formed in dummy fin 142 do not lie below gate 112, gate 114, or a gate 116 (not shown in FIG. 1), nor do they lie below spacer layer 172, spacer layer 174, spacer layer 176, or a spacer layer 178 (not shown in FIG. 1).

In FIG. 4B, the recesses formed in dummy fin 142 generally have pointed (needle) geometric shapes. From the perspective shown in FIG. 4B, the recesses formed in dummy fin 142 lie below insulating layer 162 and insulating layer 164, such that insulating material (e.g. low-k dielectric material, or other insulating material) from insulating layer 162 and insulating layer 164 extends into the recesses. The recesses formed in dummy fin 142 do not lie below gate 112, gate 114, or gate 116, nor do they lie below spacer layer 172, spacer layer 174, spacer layer 176, or spacer layer 178.

In FIG. 4C, the recesses formed in dummy fin 142 generally have round geometric shapes. From the perspective shown in FIG. 4C, the recesses formed in dummy fin 142 lie below insulating layer 162 and insulating layer 164, such that insulating material (e.g. low-k dielectric material, or other insulating material) from insulating layer 162 and insulating layer 164 extends into the recesses. The recesses formed in dummy fin 142 do not lie below gate 112, dielectric layer 184, or gate 116, nor do they lie below spacer layer 172, spacer layer 174, spacer layer 176, or spacer layer 178. FIG. 4C provides an example perspective view of dielectric layer 184 contacting dummy fin 142. It will be appreciated that dielectric layer 182, as well as a similar dielectric layer for gate 116 (not shown in FIG. 1) can also contact dummy fin 142 in a similar manner.

Figure 5A:
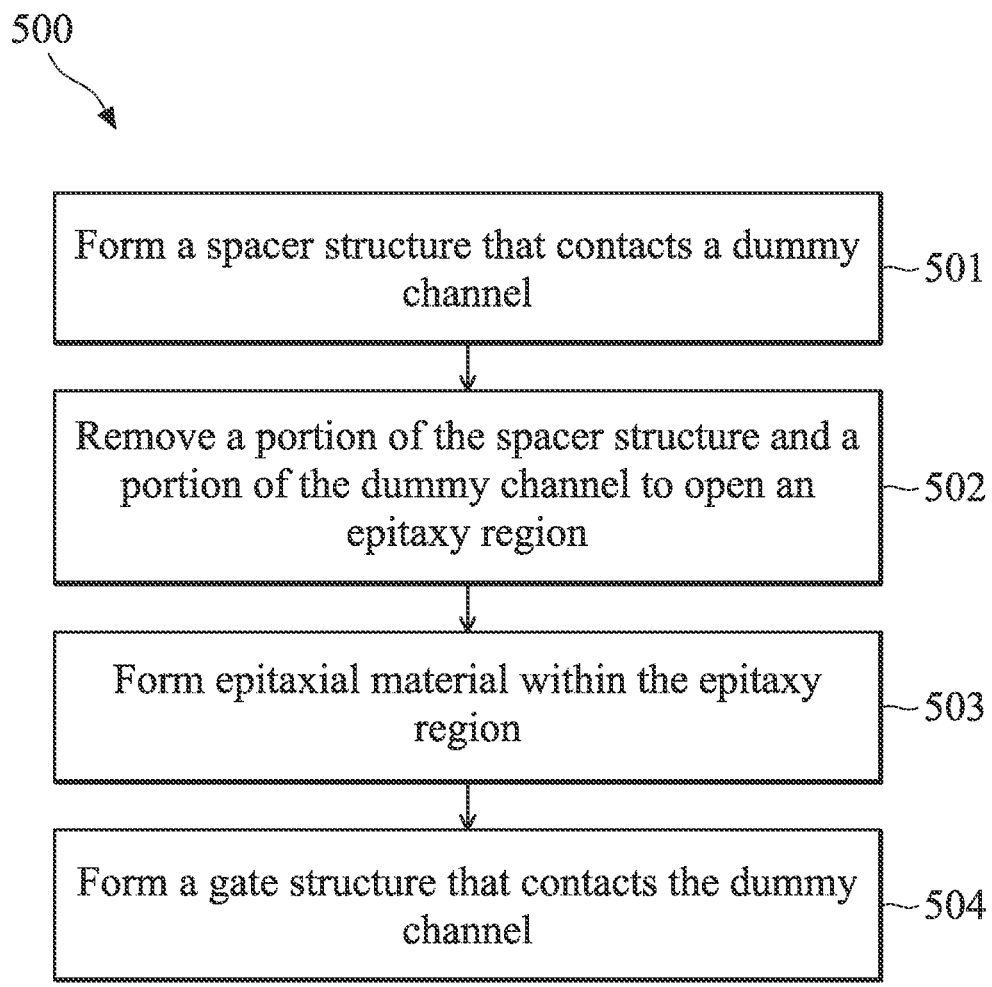
FIG. 5A is a flow diagram illustrating a process for fabricating the semiconductor device of FIG. 1, in accordance with some embodiments.

FIG. 5A is a flow diagram illustrating a process 500 for fabricating semiconductor device 100. FIGS. 5B-5E illustrate cross sections of semiconductor device 100 at various steps of process 500. Process 500 generally includes formation of one or more recesses in dummy fin 142 to provide a larger epitaxy process window for forming epitaxial material using an epitaxial growth process. The epitaxial material can ultimately form structures such as source/drain region 122 and source/drain region 124.

Figure 5B:
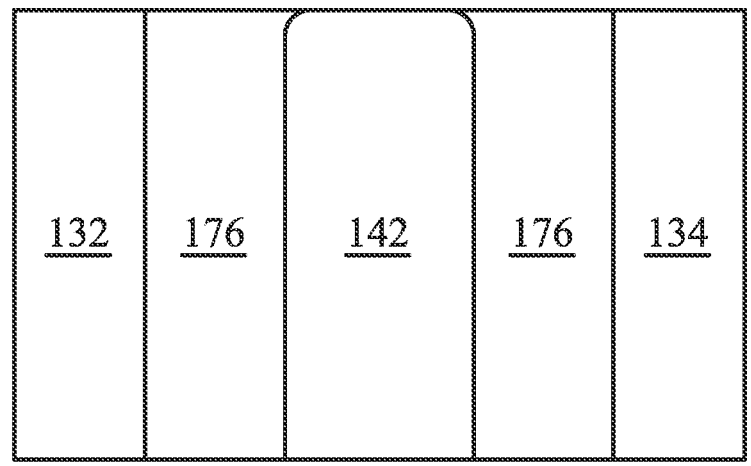
FIGS. 5B-5E illustrate cross sections of the semiconductor device of FIG. 1 at various steps of the process of FIG. 5A, in accordance with some embodiments.

At a step 501, a spacer structure that contacts a dummy fin is formed (FIG. 5B). As shown in the cross section FIG. 5B (cut from cross section 194 shown in FIG. 1), the spacer structure includes spacer layer 176. Spacer layer 176 is formed between active fin 132 and dummy fin 142, and also between dummy fin 142 and active fin 134. As discussed above, dummy fin 142 can be formed using the same or similar material as spacer layer 176, such that dummy fin 142 has the same or a similar etch rate as spacer layer 176. Dummy fin 142 can also be formed using material that is substantially different from the material used to form spacer layer 176, such that dummy fin 142 has a lower etch rate than spacer layer 176. Dummy fin 142 can also be formed using a complex combination of materials, such that some portions or layers of dummy fin 142 are formed using materials similar to the material used to form spacer layer 176, and other portions or layers of dummy fin 142 are formed using materials different from the material used to form spacer layer 176. Dummy fin 142 and spacer layer 176 can be formed using a variety of suitable deposition processes, including physical vapor deposition, chemical vapor deposition, electrochemical deposition, atomic layer deposition, and other suitable processes and combinations thereof.

Figure 5C:
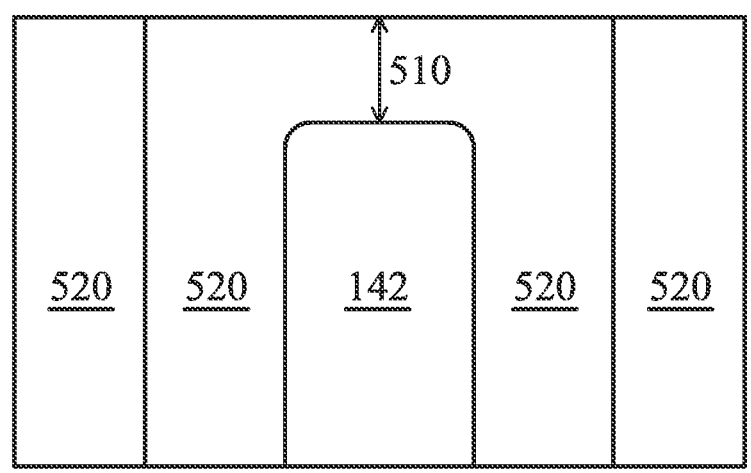

At a step 502, a portion of the spacer structure and a portion of the dummy fin are removed to open an epitaxy region (FIG. 5C). Portions of active fins can also be removed in step 502. As shown in the cross section FIG. 5C (cut from cross section 194 shown in FIG. 1), portions of spacer layer 176, dummy fin 142, active fin 132, and active fin 134 are removed, thereby forming a recess 510 in a top surface of dummy fin 142 (i.e. a surface opposite isolation structure 152) and opening an epitaxy region 520. The process used to remove the portions of spacer layer 176, dummy fin 142, active fin 132, and active fin 134 in step 502 is selected such that etch selectivity is tuned to a lower level than used in some previous approaches. Moreover, the materials used to form spacer layer 176, dummy fin 142, active fin 132, and active fin 134 are selected in accordance with the desired lower level of etch selectivity. As a result of the low etch selectivity, a higher amount of dielectric material is removed during the etching process, and recess 510 is formed in dummy fin 142. While not shown in the cross section of FIG. 5C, it will be appreciated that portions of spacer layer 176 may remain after step 502, such as illustrated in FIGS. 2F-2I.

To achieve etch selectivity tuning and provide low etch selectivity in step 502, various different approaches can be used. For example, for a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof.

Moreover, for a plasma etching process, the gas sources and/or the passivation gases can be diluted with gases such as argon (Ar), helium (He), neon (Ne), and other suitable dilutive gases and combinations thereof to control etch selectivity in step 502. In some embodiments, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute are used in step 502, however source powers, bias powers, pressures, and flow rates outside of these ranges are also contemplated. As another example, for a wet etching and cleaning process, a main etch chemical such as hydrofluoric acid (HF), fluorine ($F_2$), and other suitable main etch chemicals and combinations thereof can be used with assistive etch chemicals such as sulfuric acid ($H_2SO_4$), hydrogen chloride (HCl), hydrogen bromide (HBr), ammonia ($NH_3$), phosphoric acid ($H_3PO_4$), and other suitable assistive etch chemicals and combinations thereof as well as solvents such as deionized water, alcohol, acetone, and other suitable solvents and combinations thereof to provide lower etch selectivity.

In some embodiments, the target etch selectivity ratio (i.e. the ratio of the etch rate of conductive material to the etch rate of dielectric material) in step 502 is between 0.1 and 5, however etch selectivity ratios outside of this range are also contemplated. The use of hydrogen bromide or chlorine as an etching gas, for example, combined with reducing the amount of passivation gas used can provide lower etch selectivity. In a plasma etching process, for example, increasing the bias power can provide lower etch selectivity. In implementations where the dielectric material (e.g. spacer layer 176 and/or dummy fin 142) includes silicon nitride, adding phosphoric acid in the wet cleaning process can help remove dielectric material (e.g. to form recess 510 in dummy fin 142).

While various approaches for etch selectivity tuning in step 502 are described, it will be appreciated that additional approaches to etch selectivity tuning in step 502 not explicitly described herein are contemplated within the scope of the present disclosure. For example, when using a plasma etching process, etch selectivity can be controlled by using both a source gas and a dilute gas, by controlling the amount of passivation gas used in the plasma etching process, and by controlling the magnitude of bias power used in the plasma etching process. Also, when using a wet etching process, etch selectivity can be controlled by using both a main etch chemical and an assistive etch chemical in the wet etching process. However, it will be appreciated that different types of etching processes can be used to form recess 510 and open epitaxy region 520, such as dry etching processes, reactive ion etching processes, and other suitable processes. Different approaches for etch selectivity tuning in these processes can be used depending on the intended application and can provide improved device yield and performance.

Figure 5D:
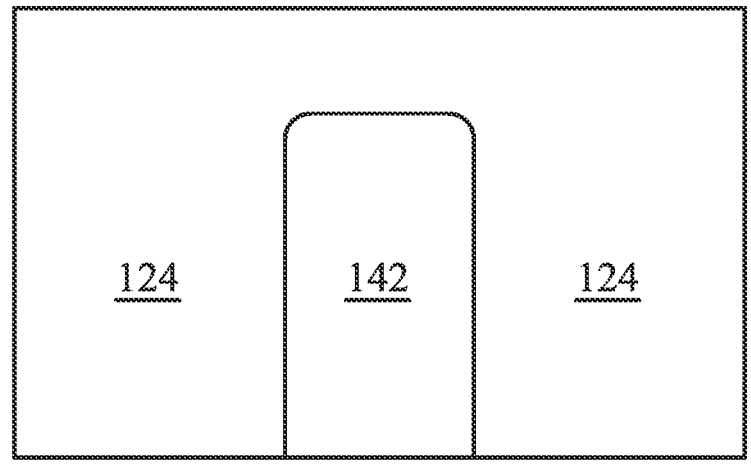

At a step 503, epitaxial material is formed within the epitaxy region (FIG. 5D). As shown in the cross section of FIG. 5D (cut from cross section 194 shown in FIG. 1), the epitaxial material used to form source/drain region 124 is formed within recess 510 and within epitaxy region 520, such that the epitaxial material is adjacent dummy fin 142. The epitaxial material formed in step 503 can be formed using epitaxial growth processes such as chemical vapor deposition (CVD), vapor-phase epitaxy (VPE), molecular-beam epitaxy (MBE), liquid-phase epitaxy (LPE), and other suitable processes and combinations thereof. While not explicitly shown in FIG. 5D, the epitaxial material formed in step 503 can include separate source and drain regions, such as separated by gap 202 discussed above. In such embodiments, the epitaxial material used to form the source and drain regions may be formed only partially within recess 510 or may not be formed within recess 510. However, even if the epitaxial material is not formed within recess 510, the formation of recess 510 in step 502 provides a larger epitaxy process window in step 503. This larger epitaxy process window can facilitate improvements in the formation of the epitaxial material (e.g. prevention of air voids or other defects when growing the epitaxial material) in step 503.

Figure 5E:
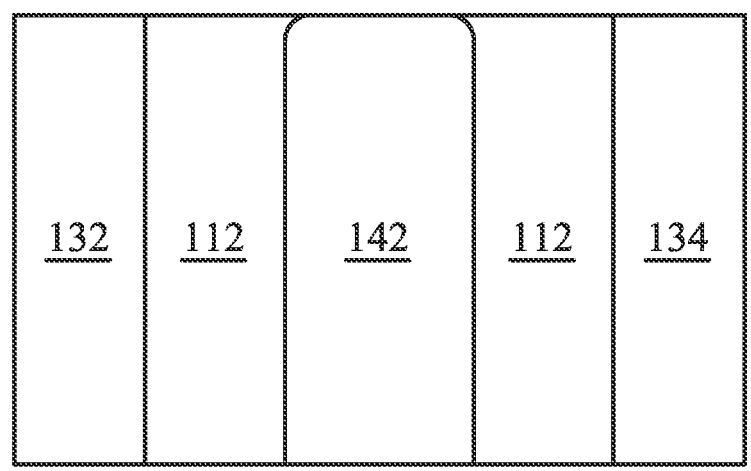

At a step 504, a gate structure that contacts the dummy fin is formed (FIG. 5E). As shown in the cross section of FIG. 5E (cut from cross section 192 shown in FIG. 1), gate 112 is formed adjacent dummy fin 142, such that gate 112 is formed between active fin 132 and dummy fin 142, and between dummy fin 142 and active fin 134. As discussed above, there is no recess formed in dummy fin 142 in this region of semiconductor device 100. Accordingly, dummy fin 142 still provides effective electrical isolation of gate 112. In some embodiments, gate 112 is a replacement gate that is formed after removing a dummy gate structure (e.g. a polysilicon gate structure).

As described in detail above, the present disclosure provides various approaches for etch selectivity control to enlarge epitaxial regions to enlarge epitaxy process windows during the semiconductor device fabrication process. Through modification of etching processes and careful selection of materials used to fabricate the semiconductor device, the approaches described herein can deliver improvements in semiconductor device yield and performance.

An implementation of the present disclosure is semiconductor device. The semiconductor device includes an isolation structure, a dummy fin extending above the isolation structure, and epitaxial material. The epitaxial material is formed adjacent the dummy fin, and the epitaxial material extends into a top surface of the dummy fin opposite the isolation structure.

Another implementation of the present disclosure is a method of fabricating a semiconductor device. The method includes forming a spacer structure that contacts a dummy fin, removing a portion of the spacer structure and a portion of the dummy fin to open an epitaxy region, and forming epitaxial material within the epitaxy region. Removing the portion of the dummy fin includes forming a recess in the dummy fin.

Yet another implementation of the present disclosure is another method of fabricating a semiconductor device. The method includes forming a dummy fin that extends above an isolation structure and is disposed in parallel relation to an active fin, forming a spacer structure that contacts the dummy fin and the active fin, removing a portion of the spacer structure, a portion of the dummy fin, and a portion of the active fin, and forming epitaxial material adjacent the dummy fin and within the recess. Removing the portion of the dummy fin includes forming a recess in a surface of the dummy fin opposite the isolation structure The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   forming a spacer structure that contacts a dummy fin;
   removing a portion of the spacer structure and a portion of the dummy fin to open an epitaxy region, wherein removing the portion of the dummy fin comprises forming a recess in the dummy fin; and
   forming epitaxial material within the epitaxy region;
   wherein removing the portion of the spacer structure and the portion of the dummy fin comprises using a plasma etching process, and wherein using the plasma etching process comprises using both a source gas and a dilute gas to control etch selectivity.

2. The method of claim 1, wherein using the plasma etching process comprises controlling an amount of passivation gas used in the plasma etching process to control etch selectivity.

3. The method of claim 1, wherein using the plasma etching process comprises controlling a magnitude of bias power used in the plasma etching process to control etch selectivity.

4. The method of claim 1, wherein removing the portion of the spacer structure and the portion of the dummy fin further comprises using a wet etching and cleaning process, and wherein using the wet etching and cleaning process comprises using both a main etch chemical and an assistive etch chemical to control etch selectivity.

5. The method of claim 1, further comprising removing a portion of an active fin that contacts the spacer structure, wherein the active fin is formed using conductive material.

6. The method of claim 1, wherein forming the recess comprises forming the recess such that a height of the recess is less than a height of the dummy fin.

7. The method of claim 1, wherein the dummy fin is formed of dielectric material.

8. The method of claim 1, wherein the etch selectivity has a ratio of a first etch rate of a conductive material to a second etch rate of a dielectric material equal to or less than 5.

9. A method of fabricating a semiconductor device, the method comprising:
   forming a dummy fin that extends above an isolation structure and is disposed in parallel relation to an active fin;
   forming a spacer structure that contacts the dummy fin and the active fin;
   removing a portion of the spacer structure, a portion of the dummy fin, and a portion of the active fin, wherein removing the portion of the dummy fin comprises forming a recess in a surface of the dummy fin opposite the isolation structure; and
   forming epitaxial material adjacent the dummy fin and within the recess;
   wherein removing the portion of the spacer structure, the portion of the dummy fin, and the portion of the active fin uses a plasma etching process, and wherein using the plasma etching process comprises using both a source gas and a dilute gas to lower etch selectivity.

10. The method of claim 9, wherein forming the recess comprises forming the recess such that a height of the recess is less than a height of the dummy fin, and wherein the height of the recess is between 3 angstroms and 4000 angstroms.

11. The method of claim 9, wherein using the plasma etching process comprises reducing an amount of passivation gas used in the plasma etching process to lower etch selectivity.

12. The method of claim 9, wherein using the plasma etching process comprises increasing a magnitude of bias power used in the plasma etching process to lower etch selectivity.

13. The method of claim 9, wherein removing the portion of the spacer structure, the portion of the dummy fin, and the portion of the active fin further comprises using a wet etching process, and wherein using the wet etching process comprises using both a main etch chemical and an assistive etch chemical to control etch selectivity.

14. The method of claim 9, wherein the dummy fin is formed of dielectric material.

15. The method of claim 9, wherein the etch selectivity has a ratio of a first etch rate of a conductive material to a second etch rate of a dielectric material equal to or less than 5.

16. A method of fabricating a semiconductor device, the method comprising:

forming a dummy fin that extends above an isolation structure and is disposed in parallel relation to an active fin;

forming a spacer structure that contacts the dummy fin and the active fin;

removing a portion of the spacer structure, a portion of the dummy fin, and a portion of the active fin through a plasma etching process; and forming epitaxial material adjacent the dummy fin;

wherein using the plasma etching process comprises using both a source gas and a dilute gas to lower etch selectivity.

17. The method of claim 16, wherein the dummy fin is formed of dielectric material.

18. The method of claim 16, wherein using the plasma etching process comprises reducing an amount of passivation gas used in the plasma etching process to lower etch selectivity.

19. The method of claim 16, wherein using the plasma etching process comprises increasing a magnitude of bias power used in the plasma etching process to lower etch selectivity.

20. The method of claim 16, wherein the etch selectivity has a ratio of a first etch rate of a conductive material to a second etch rate of a dielectric material equal to or less than 5.

* * * * *